United States Patent
Session

(10) Patent No.: US 7,732,842 B2
(45) Date of Patent: Jun. 8, 2010

(54) STRUCTURE AND METHOD FOR FORMING A PLANAR SCHOTTKY CONTACT

(75) Inventor: Fred Session, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 580 days.

(21) Appl. No.: 11/747,847

(22) Filed: May 11, 2007

(65) Prior Publication Data

US 2008/0135889 A1 Jun. 12, 2008

Related U.S. Application Data

(60) Provisional application No. 60/868,884, filed on Dec. 6, 2006.

(51) Int. Cl.
*H01L 21/28* (2006.01)
(52) U.S. Cl. .............................. 257/284; 257/E21.158; 438/570
(58) Field of Classification Search ........................ None
See application file for complete search history.

(56) References Cited

U.S. PATENT DOCUMENTS

| | | | |
|---|---|---|---|
| 6,479,394 B1 | 11/2002 | Choutov et al. | |
| 7,041,600 B2 | 5/2006 | Dokumaci et al. | |
| 7,345,342 B2 | 3/2008 | Challa | |
| 2006/0267090 A1 | 11/2006 | Sapp et al. | |

OTHER PUBLICATIONS

Y.C. Huang et al., "Characterization of SOG (spin on glass) fully etch back process for multilevel interconnection technology," SPIE vol. 2636, p. 289-298 (1995).
N. Iazzi et al., "Semi-integrated SOG/TEOS etchback process for multimetal submicron devices," SPIE vol. 1803, p. 77-88 (1992).
PCT/US 07/85722 filed Nov. 28, 2007 Int'l. Search Report and Written Opinion of the ISA.

*Primary Examiner*—Roy K Potter
(74) *Attorney, Agent, or Firm*—Townsend and Townsend and Crew LLP

(57) ABSTRACT

A monolithically integrated trench FET and Schottky diode includes a plurality of trenches extending into a FET region and a Schottky region of a semiconductor layer. A trench in the Schottky region includes a dielectric layer lining the trench sidewalls, and a conductive electrode having a top surface that is substantially coplanar with a top surface of the semiconductor layer adjacent the trench. An interconnect layer electrically contacts the semiconductor layer in the Schottky region so as to form a Schottky contact with the semiconductor layer.

29 Claims, 5 Drawing Sheets

STRUCTURE AND METHOD FOR FORMING A PLANAR SCHOTTKY CONTACT

CROSS-REFERENCES TO RELATED APPLICATIONS

This application claims the benefit of U.S. Provisional Application No. 60/868,884, filed Dec. 6, 2006, which disclosure is incorporated herein by reference in its entirety for all purposes.

This application is related to the commonly assigned U.S. application Ser. No. 11/026,276, filed Dec. 29, 2004, which disclosure is incorporated herein by reference in its entirety for all purposes.

BACKGROUND OF THE INVENTION

The present invention relates to semiconductor power device technology and more particularly to monolithically integrated trench FET and Schottky diode devices as well as trench MOS barrier Schottky (TMBS) rectifiers, and methods of manufacturing the same.

In power device structures where Schottky diode is integrated with a trench gate structure (e.g., TMBS rectifiers or monolithically integrated trench gate FET and Schottky diode devices), known Schottky contact etch techniques produce topologies that lead to poor barrier metal step coverage and high leakage current. These techniques are based on standard contact etch processes where selectivity to the underlying material is desirable. One such technique is shown in FIGS. 1A-1B.

As depicted in FIGS. 1A and 1B, in the Schottky diode region of the device, a selective dielectric etch is carried out to form the Schottky contact opening as defined by remaining dielectric portions 116. Because the resulting topography in the Schottky region is not suitable for forming the barrier metal, a selective soft etch of the silicon is carried out to improve the topology. However, the soft etch process: (1) adds another process step, (2) leads to the undercutting of source contact 132 thus bringing source metal closer to the channel region, and (3) adversely affects the metal fill characteristics of the source contact. Also, as can bee seen in FIG. 1B, while the topography is somewhat improved by the soft etch, the barrier metal 122 still has poor step coverage.

Thus, there is a need for a technique which significantly improves the topography in the Schottky contact area and minimizes the leakage current.

BRIEF SUMMARY OF THE INVENTION

In accordance with an embodiment of the invention, a monolithically integrated trench FET and Schottky diode includes a plurality of trenches extending into a FET region and a Schottky region of a semiconductor layer. A trench in the Schottky region includes a dielectric layer lining the trench sidewalls and a conductive electrode having a top surface that is substantially coplanar with a top surface of the semiconductor region adjacent the trench. An interconnect layer electrically contacts the semiconductor layer in the Schottky region so as to form a Schottky contact with the semiconductor layer.

In one embodiment, a trench in the FET region includes a shield dielectric layer lining lower sidewalls and bottom of the trench, a shield electrode disposed in a bottom portion of the trench, an inter-electrode dielectric layer over the shield electrode, and a gate dielectric layer lining upper trench sidewalls. The gate dielectric layer is thinner than the shield dielectric layer. The trench in the FET region further includes a gate electrode over the inter-electrode dielectric layer.

In another embodiment, a trench in the Schottky region includes only one conductive electrode.

In accordance with another embodiment of the invention, a method of forming a monolithically integrated trench FET and Schottky diode includes the following steps. A plurality of trenches is formed in a FET region and a Schottky region of a semiconductor layer. A recessed conductive electrode is formed in each trench. A contact opening is formed in the Schottky region by removing at least a portion of the semiconductor layer and a portion of a recessed conductive electrode in a trench so that a top surface of the recessed conductive electrode and a top surface of the semiconductor layer in the Schottky region are substantially coplanar.

In one embodiment, after forming the contact opening, an interconnect layer electrically contacting surfaces of the semiconductor layer is formed so as to form a Schottky contact with the semiconductor layer.

In another embodiment, prior to forming the contact opening, a dielectric layer is formed over the semiconductor layer, and the step of forming a contact opening further includes removing a portion of the dielectric material.

In yet another embodiment, the portion of the dielectric layer, the at least a portion of the semiconductor layer and the portion of a conductive electrode in a trench are all removed using an etch process that etches the dielectric layer and the semiconductor substrate at substantially the same rate.

In still another embodiment, the portion of the dielectric layer, the at least a portion of the semiconductor layer and the portion of a conductive electrode in a trench are all removed using an etch process that has low selectivity between the dielectric layer and the semiconductor layer.

In still another embodiment, prior to forming a contact opening, a protective layer is formed over the dielectric layer, followed by removing at least a portion of the protective layer to define the contact opening.

A further understanding of the nature and the advantages of the invention disclosed herein may be realized by reference to the remaining portions of the specification and the attached drawings.

DETAILED DESCRIPTION OF THE INVENTION

In accordance with an embodiment of the invention, a Schottky contact etch process with substantially reduced dielectric to silicon selectivity is disclosed which eliminates the need for intermediate steps (such as a soft etch). The reduced selectivity results in a more planarized (i.e., reduced topology) surface. This reduced topology in turn results in formation of a substantially planar barrier metal which provides a significant reduction (10 times in one embodiment) in drain-source leakage. Other features and advantages of the invention are disclosed below.

FIGS. 2A-2F are simplified cross section views at various stages of a process for forming a monolithically integrated shielded-gate FET and Schottky diode, in accordance with one embodiment of the invention. In FIGS. 2A-2F, the Schottky diode region is shown on the right side of the figures and the FET region is shown on the left side. It is to be understood that only a small portion of the active region of the device is shown in FIGS. 2A-2F, and many ways of integrating the Schottky diode and the FET are possible. Many Schottky regions similar to that shown in FIGS. 2A-2F are typically dispersed throughout the active region of the device in a predetermined frequency which in part depends on the desired percentage of Schottky diode area. While three trenches are shown in a given Schottky region, more or fewer trenches may be formed in the Schottky region.

Figure 1A:
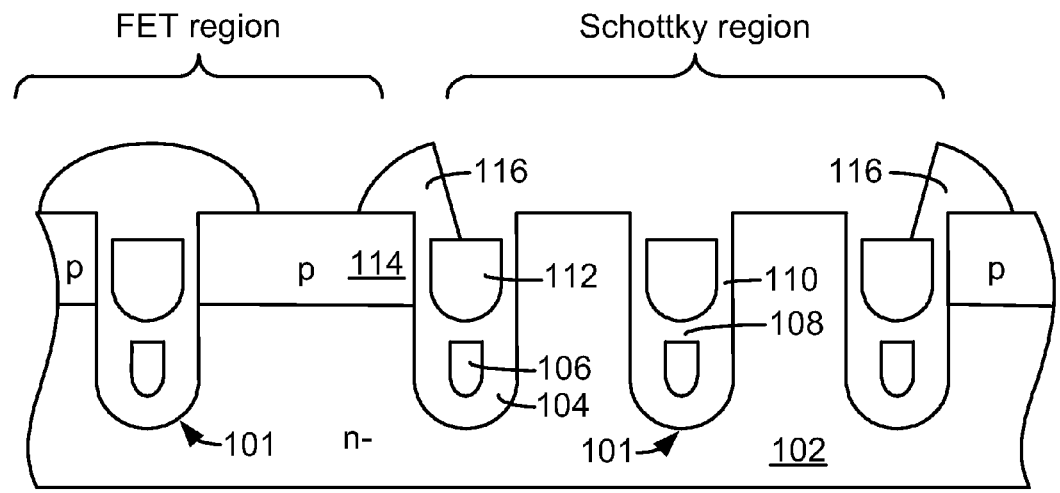
FIGS. 1A-1B are simplified cross section views depicting a known Schottky contact etch technique.
Figure 1B:
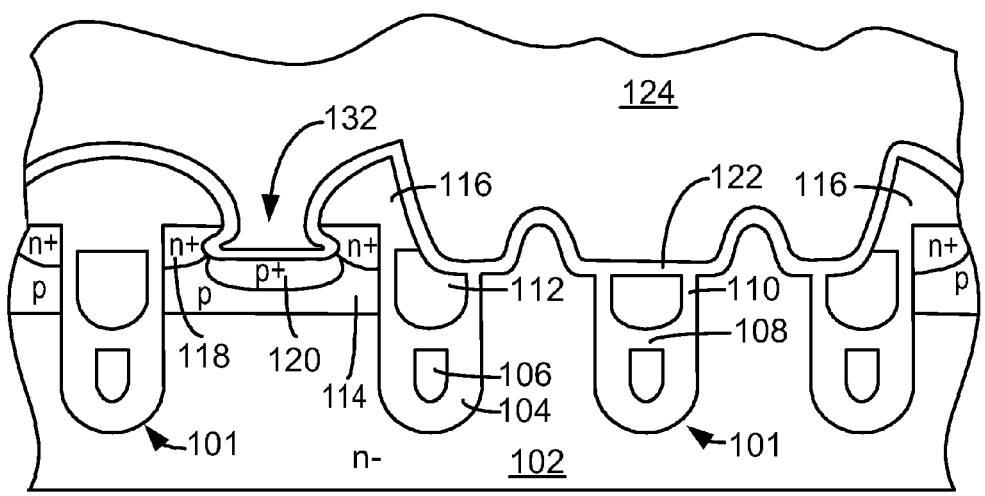
Figure 2A:
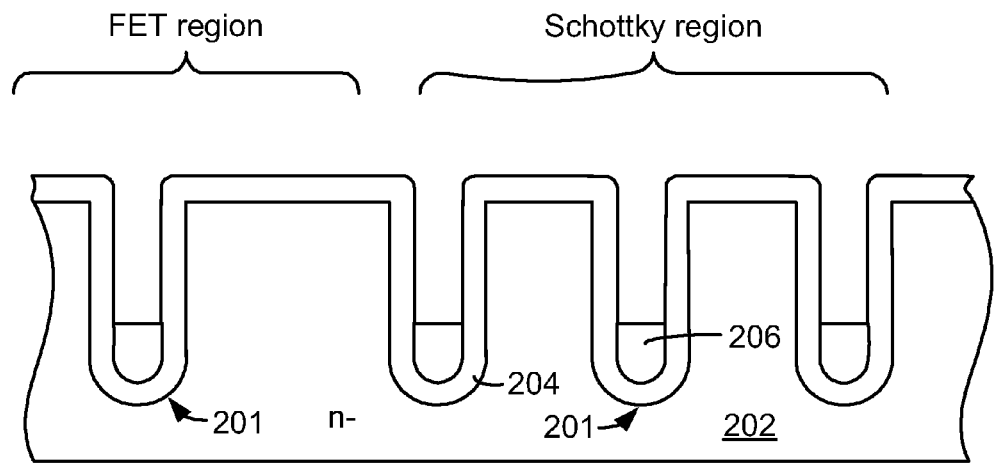
FIGS. 2A-2F are simplified cross section views at various stages of a process for forming a monolithically integrated shielded-gate FET and Schottky diode, according to one embodiment of the invention.

In FIG. 2A, trenches 201 extend into semiconductor region 202. In one embodiment, the semiconductor region is a lightly doped n-type epitaxial layer formed over a highly doped substrate (not shown), and trenches 201 terminate in the epitaxial layer. In another embodiment, trenches 201 extend into and terminate in the substrate. In FIG. 2A, a shield dielectric layer 204 (e.g., comprising oxide) lining the trench sidewalls and bottom is formed using known techniques. Shield electrode 206 (e.g., comprising doped or undoped polysilicon) is then formed in a bottom portion of each trench using conventional methods.

Figure 2B:
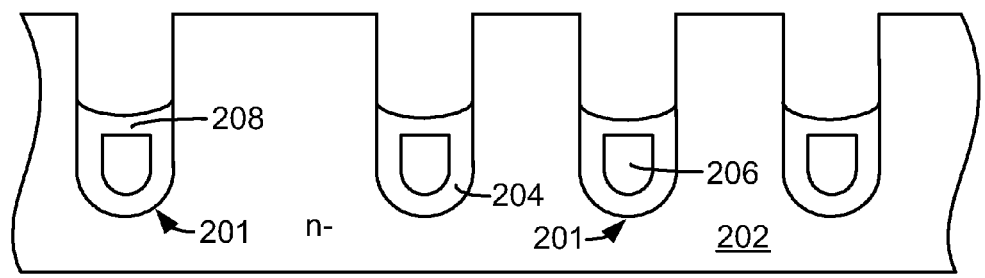
Figure 2C:
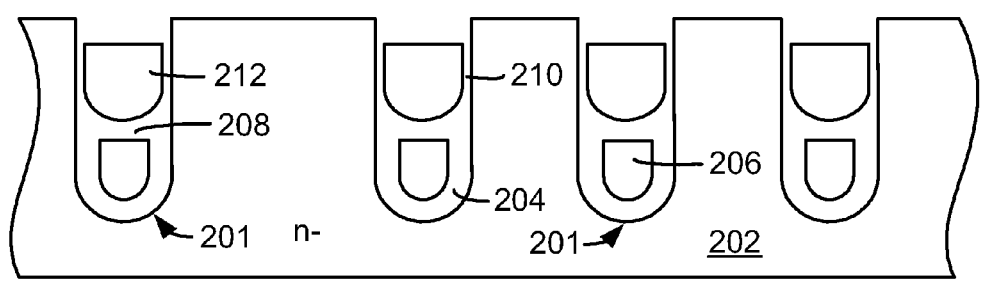
Figure 2D:
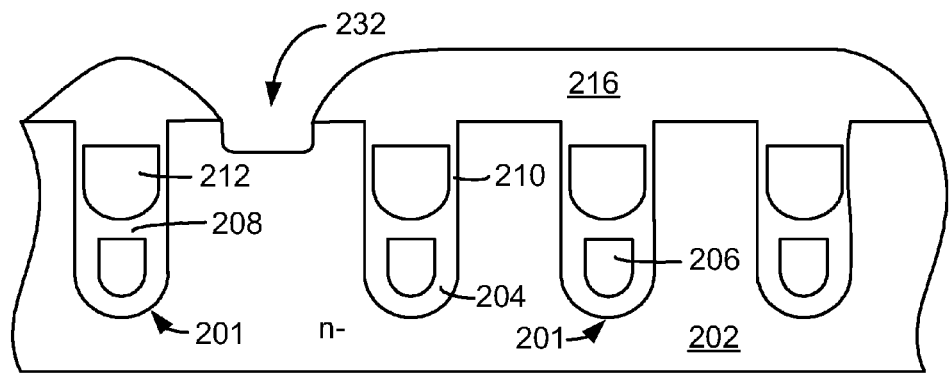

In FIG. 2B, inter-electrode dielectric 208 (e.g., comprising oxide) is formed over shield electrode 206 in each trench using known methods. In FIG. 2C, a recessed gate electrode 212 (e.g., comprising doped or undoped polysilicon) is formed over inter-electrode dielectric 208 in each trench using conventional techniques. In FIG. 2D, a dielectric layer 216 (e.g., comprising one or more of BPSG, undoped oxide, and PSG) is formed over the structure. In the FET region, source contact openings 232 are formed in dielectric layer 216 using known masking techniques. The silicon surfaces exposed through source contact openings are then recessed to form heavy body contact openings as shown.

Figure 2E:
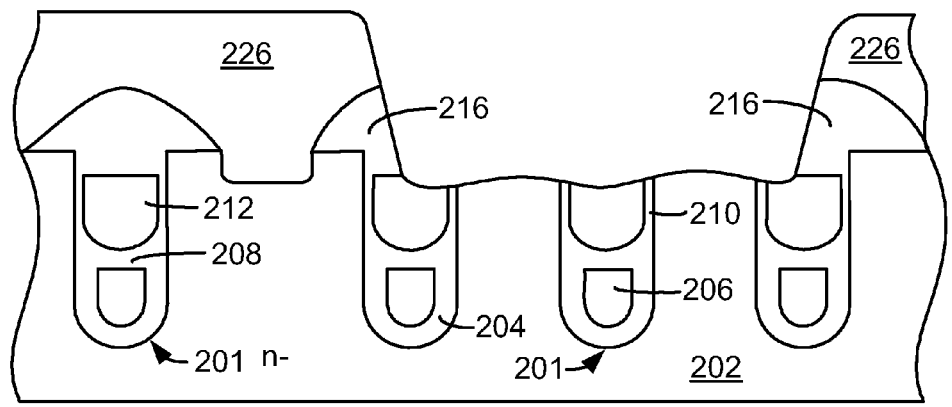

In FIG. 2E, a masking layer 226 (e.g., comprising photoresist) having openings only over Schottky regions is formed using conventional techniques. Masking layer 226 thus covers all FET regions. Using an etch process that etches dielectric layer 216 at substantially the same rate as it would etch the underlying silicon, the exposed portions of dielectric layer 216 and a portion of the underlying silicon are removed such that a planar surface is obtained in the Schottky region. In accordance with an embodiment of the invention wherein dielectric layer 216 comprises BPSG, the etch process in FIG. 2E is designed to have minimal to no selectivity between silicon and oxide. As can be seen, the etch process depicted in FIG. 2E does not require a separate planarization medium (such as spin on glass) or CMP, and is a localized etch (i.e., is limited to the Schottky regions) and thus is not a global etch.

The reduction of the dielectric to silicon selectivity can be achieved in a number of ways. In one embodiment, the gas ratios are modified to minimize or eliminate the polymerizing gases which inhibit the silicon etch rate. In another embodiment, the free fluorine concentration is increased in the plasma to enhance the silicon etch rate. This can be achieved using gas additives such as oxygen, SF6 (sulfur hexafluoride) and/or NF3 (nitrogen tri-fluoride). The free fluorine concentration can also be increased by increasing the RF delivery frequency to better dissociate the etchant gas. In yet another embodiment, the pressure and power are manipulated to make the etch a less physical and more chemical process. This can be achieved by reducing the RF bias on the wafer. Any one or a combination of these techniques may be used to reduce the dielectric to silicon selectivity. In some embodiments, various combinations of RF delivery frequencies between 10 KHz and 3 GHz (for example, nominal value of 400 KHz), process pressures between 10 mTorr and 1 Torr (for example, nominal Value of 600 mTorr), input powers between 100 Watt and 2000 Watt (for example, nominal value of 400 Watt), main etchant gas flow between 40 sccm and 100 sccm (for example, nominal value of 80 sccm), and oxygen, nitrogen or fluorine addition between 0 sccm to 100 sccm (for example, nominal value of 20 sccm), and process temperatures of 0° C. to 100° C. (for example, nominal value of 20° C.) are used to arrive at the desired selectivity.

Figure 2F:
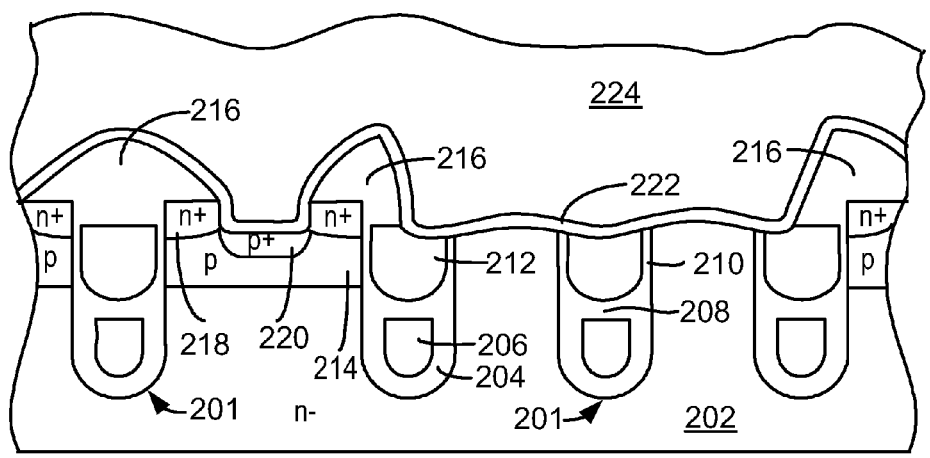

In FIG. 2F, a conformal barrier metal layer 222 is formed over the structure using known techniques. As can be seen, barrier metal 222 is substantially planar in the Schottky region. In one embodiment, barrier metal 222 comprises a bi-layer of titanium-tungsten and titanium-silicide. A conductive layer 224 (e.g., comprising aluminum) is then formed over barrier metal 222. Conductive layer 224 together with barrier metal layer 222 forms the source interconnect. As can be seen the source interconnect electrically contacts heavy body region 220 and source regions 218 but is insulated from gate electrodes 212 in the FET region. In the Schottky region, Schottky diode is formed where the source interconnect contacts the mesa regions 202 between the trenches. The source interconnect also contacts gate electrodes 212 in the Schottky region trenches. Thus, gate electrodes 212 in the Schottky region are electrically biased to the source potential during operation.

The various regions of the FET, including body region 214, heavy body region 220 and source regions 218 are included in FIG. 2F only to illustrate the complete device, and as such do not reflect the process sequence in which they are formed. That is, the body region, heavy body region and source regions may be formed at any suitable stage of the process.

Figure 3:
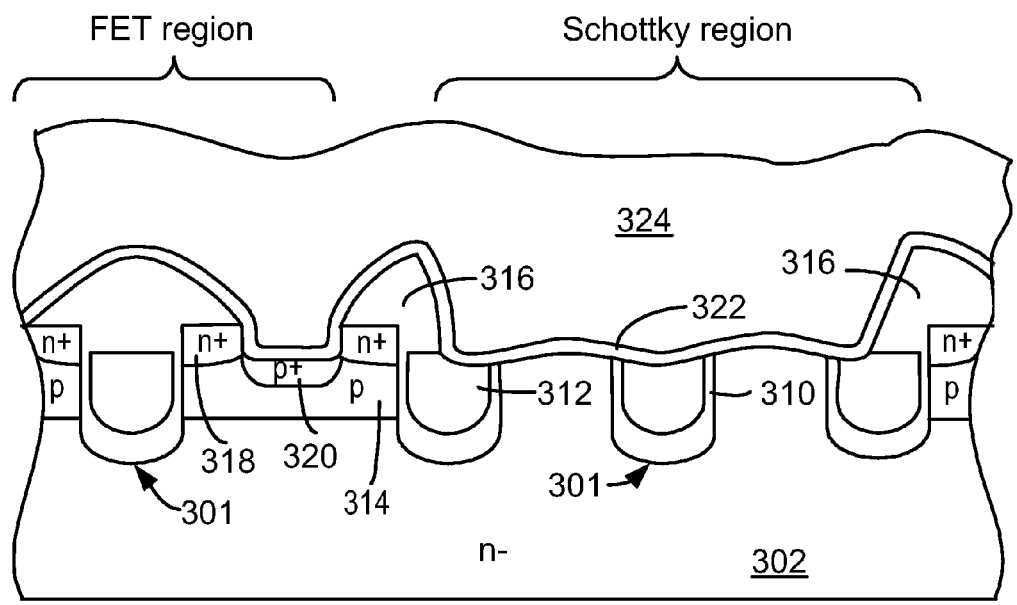
FIG. 3 shows a simplified cross section view of a monolithically integrated trench gate FET and Schottky diode wherein the Schottky contact etch technique according to an embodiment of the invention is used to obtain a substantially planar interconnect layer in the Schottky region.

FIG. 3 is a simplified cross section view of a monolithically integrated trench gate FET and Schottky diode wherein the Schottky contact etch technique according to an embodiment of the invention is advantageously used to obtain a substantially planar barrier metal layer in the Schottky region. Trenches 301 which include a gate electrode 312 with no underlying shield electrode terminate in drift region 302. Alternatively, trenches 301 may extend into and terminate in a highly doped substrate (not shown) underlying drift region 302. As shown, each trench 301 includes a thick-bottom-dielectric (e.g., comprising oxide) along a bottom portion of the trench to reduce the gate to drain capacitance, and a thinner gate dielectric (e.g., comprising gate oxide) lining the trench sidewalls. Alternatively, a gate dielectric layer with a relatively uniform thickness extends along the trench sidewalls and bottom. The same Schottky contact etch process and its variations described in connection with the preceding embodiment is used to achieve a substantially planar surface in the Schottky region. A substantially planar barrier metal 322 is thus obtained in the Schottky region.

Note that while the embodiments depicted by FIGS. 2A-2F and 3 show n-channel FETs, p-channel FETs may be obtained by reversing the polarity of the various semiconductor regions. Further, in the embodiment where drift regions 202 and 302 are an epitaxial layer extending over a substrate, MOSFETs are obtained where the substrate and epitaxial layer are of the same conductivity type, and IGBTs are obtained where the substrate has the opposite conductivity type to that of the epitaxial layer. These are only few trench FET devices in which the Schottky contact etch is used in accordance with the invention to obtain planar surfaces and superior leakage performance. The Schottky contact etch technique and its variants disclosed herein may be used in forming many other types of structures and devices to obtain similar advantages and features. For example, various types and structures of power devices are disclosed in the above-referenced U.S. patent application Ser. No. 11/026,276, filed Dec. 29, 2004. One skilled in the art would know how to integrate a Schottky diode in these devices, in particular in the trench gate, shielded gate, and charge balance devices shown, for example, in FIGS. 1, 2A, 3A, 3B, 4A, 4C, 5C, 9B, 9C, 10-12, and 24 of the U.S. patent application Ser. No. 11/026, 276. One skilled in the art would further know how to incorporate the Schottky contact etch or its variants disclosed herein in forming such integrated FET and Schottky diode devices in view of this disclosure.

Figure 4:
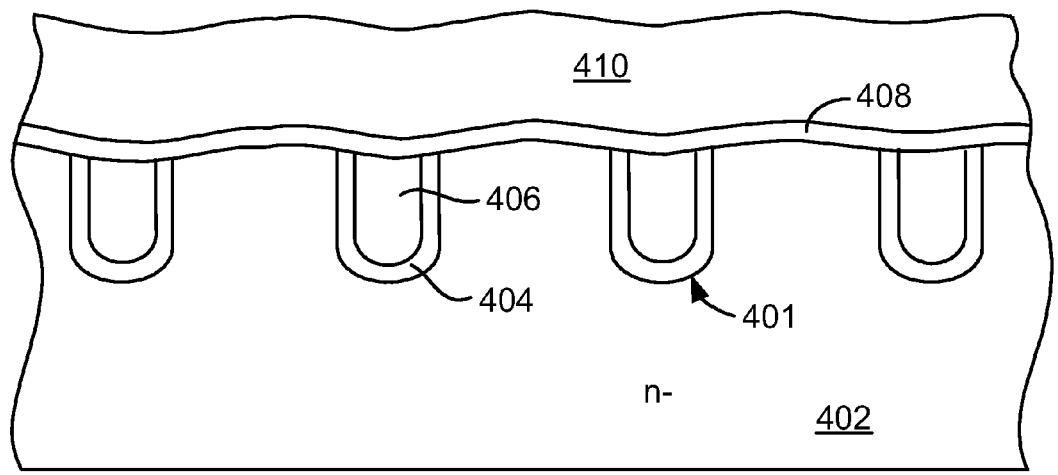
FIG. 4 shows a simplified cross section view of a TMBS rectifier wherein the Schottky contact etch according to an embodiment of the invention is used to obtain a substantially planar interconnect layer.

FIG. 4 shows a simplified cross section view of a TMBS rectifier wherein the Schottky contact etch technique described above is used to obtain a substantially planar barrier metal layer 408. Each trench 401 is lined with an insulating layer 406 (e.g., comprising oxide) and is filled with a conductive electrode 406 (e.g., comprising doped or undoped polysilicon). Conductive electrodes 406 are electrically connected and thus biased to the same potential as the top-side interconnect layer which comprises conductor 410 (e.g., comprising aluminum) and barrier metal layer 408 (e.g., comprising a bi-layer of titanium-tungsten and titanium-silicide). The operation of the devices shown in FIGS. 2F, 3 and 4 are well known in the art and thus will not be described.

Figure 5:
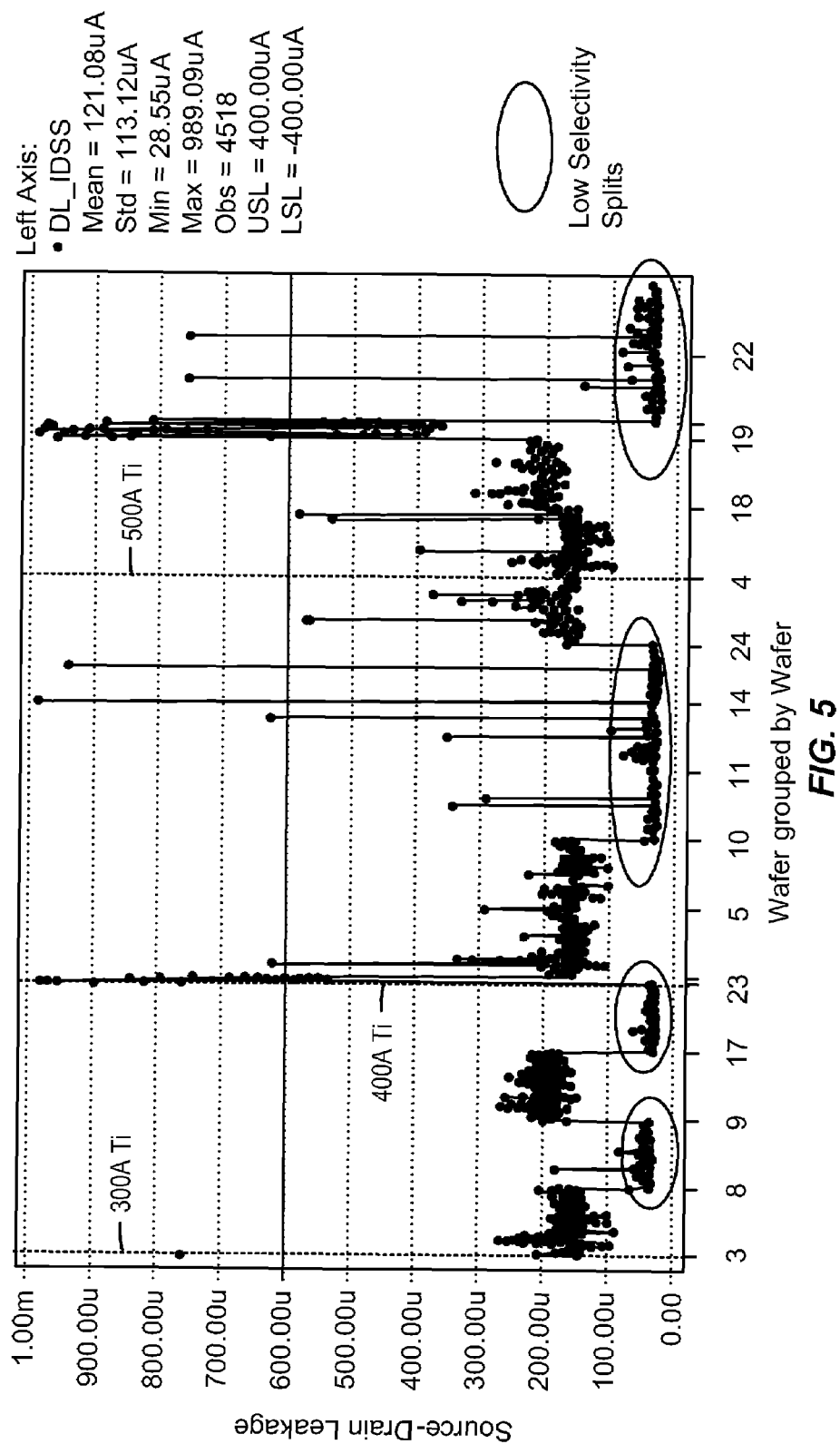
FIG. 5 is a graph which compares the drain-source leakage for monolithically integrated trench gate FET and Schottky diode devices fabricated using the low selectivity etch technique in accordance with one embodiment of the invention versus monolithically integrated trench gate FET and Schottky diode devices fabricated using conventional etch techniques.

FIG. 5 is graph which compares the drain-source leakage for monolithically integrated trench gate FET and Schottky diode devices fabricated using the low selectivity etch technique in accordance with one embodiment of the invention versus monolithically integrated trench gate FET and Schottky diode devices fabricated using conventional etch techniques. The vertical axis in the FIG. 5 graph represents the source-drain leakage and the horizontal axis represents the various groups of devices. The data points for devices formed using low selectively etch are circled. As can be seen, the source-drain leakage of devices using low selectivity etch is substantially lower (by a factor of 6 or more) as compared to those of devices using conventional etch techniques.

The table below tabulates source-drain leakage values for three conventional devices where no soft etch is used, 10 seconds of soft etch is used, and 20 seconds of soft etch is used. Also shown in the Table are corresponding source-drain leakage values for a device fabricated using the low selectivity etch technique in accordance with an embodiment of the invention. As can be seen, even where 20 seconds of soft etch is carried out, the low selectivity etch process yields a far better leakage performance.

|  | 0 sec. SE | 10 sec. | 20 sec. |
| --- | --- | --- | --- |
| Control | 667 µA | 180 µA | 158 µA |
| Low Selectivity Process | 38 µA | 35 µA | 35 µA |

Thus, low selectivity etch techniques for planarizing a Schottky contact structure have been described which do not require intermediate steps such as using a planarizing medium (e.g., spin on glass) or CMP. The dielectric (e.g., oxide) is etched at, or close to, the same rate as the underlying silicon in order to reduce the topology in the Schottky contact area. The reduced topology leads to better barrier metal step coverage. A substantially lower source-drain leakage current is thus achieved without the need for a soft etch.

Although a number of specific embodiments are shown and described herein, embodiments of the invention are not limited thereto. For example, while FIGS. 2A-2F show the Schottky region trenches to be identical in structure to the FET region trenches, the invention is not limited as such. In one embodiment, the Schottky region trenches are formed to include only one conductive electrode (e.g., shield electrode which extends to near the top of the trench) using known techniques. Therefore, the scope of the present invention should be determined not with reference to the above description but should, instead, be determined with reference to the appended claim, along with their full scope of equivalents.

What is claimed is:

1. A monolithically integrated trench FET and Schottky diode, comprising:
a plurality of trenches extending into a FET region and a Schottky region of a semiconductor layer, a trench in the Schottky region having a dielectric layer lining the trench sidewalls and a conductive electrode having a top surface that is substantially coplanar with a top surface of the semiconductor layer adjacent the trench; and
an interconnect layer electrically contacting the semiconductor layer in the Schottky region so as to form a Schottky contact with the semiconductor layer.

2. The monolithically integrated trench FET and Schottky diode of claim 1 wherein a trench in the FET region includes a dielectric layer lining the trench sidewalls and a conductive electrode, and wherein the interconnect layer electrically contacts the conductive electrode in the trench in the Schottky region but is electrically insulated from the conductive electrode in the trench in the FET region.

3. The monolithically integrated trench FET and Schottky diode of claim 1 wherein a surface of the semiconductor layer in the Schottky region is lower relative to a surface of the semiconductor layer in the FET region.

4. The monolithically integrated trench FET and Schottky diode of claim 1 wherein a trench in the FET region includes a dielectric layer lining the trench sidewalls and a conductive electrode having a top surface that is higher than a top surface of the conductive electrode in the trench in the Schottky region.

5. The monolithically integrated trench FET and Schottky diode of claim 1 wherein the FET region comprises:
a well region extending in the semiconductor layer;
source regions in the well region adjacent the trench in the FET region, the source regions and well region being of opposite conductivity type; and heavy body region in the well region, the heavy body region being of the same conductivity type but higher doping concentration than the well region, wherein the interconnect layer electrically contacts the source and heavy body regions.

6. The monolithically integrated trench FET and Schottky diode of claim 5 wherein the trench FET is a trench MOSFET, the semiconductor layer comprising an epitaxial layer extending over a substrate, the epitaxial layer having a lower doping concentration than the epitaxial layer, the well region extending in the epitaxial layer and having a conductivity type opposite that of the epitaxial layer and the substrate.

7. The monolithically integrated trench FET and Schottky diode of claim 5 wherein the trench FET is a trench IGBT, the semiconductor layer comprising an epitaxial layer extending over a substrate, the epitaxial layer having a lower doping concentration than the epitaxial layer, the well region extending in the epitaxial layer and having a conductivity type opposite that of the epitaxial layer, and the well region and the substrate having the same conductivity type.

8. The monolithically integrated trench FET and Schottky diode of claim 1 wherein a trench in the FET region includes:
   a shield dielectric layer lining lower sidewalls and bottom of the trench;
   a shield electrode disposed in a bottom portion of the trench;
   an inter-electrode dielectric layer over the shield electrode;
   a gate dielectric layer lining upper trench sidewalls, the gate dielectric layer being thinner than the shield dielectric layer; and
   a gate electrode over the inter-electrode dielectric layer.

9. The monolithically integrated trench FET and Schottky diode of claim 8 wherein the trench in the Schottky region includes only one conductive electrode.

10. The monolithically integrated trench FET and Schottky diode of claim 1 wherein each of the plurality of trenches in the FET region and the Schottky diode region includes:
    a shield dielectric layer lining lower sidewalls and bottom of the trench;
    a shield electrode disposed in a bottom portion of the trench;
    an inter-electrode dielectric layer over the shield electrode;
    a gate dielectric layer lining upper trench sidewalls, the gate dielectric layer being thinner than the shield dielectric layer; and
    a gate electrode over each inter-electrode dielectric layer.

11. The monolithically integrated trench FET and Schottky diode of claim 1 wherein a trench in the FET region includes:
    a dielectric layer lining the trench sidewalls and bottom, the dielectric layer being thicker along the trench bottom than along the trench sidewalls; and
    a recessed gate electrode.

12. A semiconductor structure, comprising:
    a first trench in a first region of a semiconductor layer, the first trench having a conductive electrode therein, wherein a top surface the conductive electrode is recessed relative to a top surface of the first region of the semiconductor layer; and
    a second trench in a second region of the semiconductor layer, the second trench having a conductive electrode therein, wherein the conductive electrode in the second trench has a top surface that is substantially coplanar with a top surface of the second region of the semiconductor layer,
    wherein a top surface of the first region of the semiconductor layer is higher than a top surface of the second region of the semiconductor layer.

13. The semiconductor of claim 12 wherein the first region of the semiconductor layer houses a trench FET and the second region of the semiconductor layer houses a rectifier.

14. A method of forming a monolithically integrated trench FET and Schottky diode, the method comprising:
    forming a plurality of wenches in a FET region and a Schottky region of a semiconductor layer;
    forming a recessed conductive electrode in each trench; and
    forming a contact opening in the Schottky region by removing at least a portion of the semiconductor layer and a portion of a recessed conductive electrode in a trench so that a top surface of the recessed conductive electrode and a top surface of the semiconductor layer in the Schottky region are substantially coplanar.

15. The method of claim 14 further comprising:
    after the step of forming a contact opening, forming an interconnect layer electrically contacting surfaces of the semiconductor layer so as to form a Schottky contact with the semiconductor layer.

16. The method of claim 15 wherein the interconnect layer is formed so as to electrically contact the recessed conductive electrode in one or more trenches in the Schottky region but is electrically insulated from the recessed conductive electrode in one or more trenches in the FET region.

17. The method of claim 14 wherein after the step of forming a contact opening results in a surface of the semiconductor layer in the Schottky region being lower relative to a surface of the semiconductor layer in the FET region.

18. The method of claim 14 wherein after the step of forming a contact opening, a top sufface of a recessed conductive electrode in a wench in the FET region is higher than a top surface of a recessed conductive electrode in a trench in the Schottky region.

19. The method of claim 14 further comprising:
    prior to the step of forming a contact opening, forming a dielectric layer over the semiconductor layer,
    wherein the step of forming a contact opening further includes removing a portion of the dielectric material.

20. The method of claim 19 wherein the portion of the dielectric layer, the at least a portion of the semiconductor layer and the portion of a conductive electrode in a trench are all removed using an etch process that etches the dielectric layer and the semiconductor substrate at substantially the same rate.

21. The method of claim 19 wherein the portion of the dielectric layer, the at least a portion of the semiconductor layer and the portion of a conductive electrode in a trench are all removed using an etch process that has low selectivity between the dielectric layer and the semiconductor layer.

22. The method of claim 19 further comprising:
    prior to the step of forming a contact opening:
    forming a protective layer over the dielectric layer; and
    removing at least a portion of the protective layer to define the contact opening.

23. The method of claim 20 further comprising:
    prior to the step of forming a protective layer, forming a source contact opening in a portion of the dielectric layer that extends in the FET region.

24. The method of claim 14 further comprising:
    forming a well region in the FET region of the semiconductor layer;
    forming source regions in the well region adjacent a trench in the FET region, the source regions and the well region being of opposite conductivity type; and forming a heavy body region in the well region, the heavy body region being of the same conductivity type but higher doping concentration than the well region.

25. The method of claim 14 further comprising:
forming a shield dielectric layer lining lower sidewalls and bottom of a first trench in the FET region;
forming a shield electrode disposed in a bottom portion of the first trench;
forming a gate dielectric layer lining upper trench sidewalls of the first trench, the gate dielectric layer being thinner than the shield dielectric layer; and
forming a gate electrode over the shield electrode.

26. The method of claim 14 further comprising:
forming a shield dielectric layer lining lower sidewalls and bottom of each of a first trench in the FET region and a second trench in the Schottky region;
forming a shield electrode disposed in a bottom portion of each of the first and second trenches;
forming a gate dielectric layer lining upper sidewalls of each of the first and second trenches, the gate dielectric layer being thinner than the shield dielectric layer; and
forming a gate electrode over the shield electrode.

27. A method of forming a semiconductor structure, comprising:
forming a plurality of trenches in a semiconductor layer;
forming a first dielectric layer lining the trench sidewalls and bottom;
forming a conductive electrode in each trench;
forming a second dielectric layer over the semiconductor layer;
forming a contact opening by removing a portion of the second dielectric layer, a portion of the semiconductor layer and a portion of each of one or more conductive electrodes in the plurality of trenches so that a top surface of the one or more conductive electrodes and a top surface of the semiconductor layer in the contact opening are substantially coplanar; and
forming an interconnect layer electrically contacting the one or more conductive electrodes and the semiconductor layer through the contact opening such that the interconnect layer forms a Schottky contact with the semiconductor layer.

28. The method of claim 27 wherein the portion of the second dielectric layer, the portion of the semiconductor layer and the portion of each of the one or more conductive electrodes are all removed using an etch process that etches the second dielectric layer and the semiconductor substrate at substantially the same rate.

29. The method of claim 27 wherein the portion of the second dielectric layer, the portion of the semiconductor layer and the portion of each of one or more conductive electrodes are all removed using an etch process that has low selectivity between the second dielectric layer and the semiconductor layer.

* * * * *